(12) United States Patent
Ikeda et al.

(10) Patent No.: US 7,359,414 B2
(45) Date of Patent: Apr. 15, 2008

(54) EXCESSIVE CURRENT INPUT SUPPRESSING SEMICONDUCTOR LASER LIGHT EMITTING CIRCUIT

(75) Inventors: Junichi Ikeda, Hyogo-ken (JP); Hiroaki Kyougoku, Ohsaka-fu (JP)

(73) Assignee: Ricoh Company, Ltd., Ohta-Ku, Tokyo (JP)

( * ) Notice: Subject to any disclaimer, the term of this patent is extended or adjusted under 35 U.S.C. 154(b) by 242 days.

(21) Appl. No.: 10/970,994

(22) Filed: Oct. 25, 2004

(65) Prior Publication Data

US 2005/0135440 A1 Jun. 23, 2005

(30) Foreign Application Priority Data

Oct. 27, 2003 (JP) ............................. 2003-366061

(51) Int. Cl.
*H01S 3/00* (2006.01)
(52) U.S. Cl. ................. 372/38.07; 372/38.01; 372/29.011; 372/29.015
(58) Field of Classification Search ........... 372/29.011, 372/38.01, 29.015, 38.07
See application file for complete search history.

(56) References Cited

U.S. PATENT DOCUMENTS

| | | | | |
|---|---|---|---|---|
| 5,530,712 A | * | 6/1996 | Solina et al. ............... 372/31 |
| 5,675,600 A | * | 10/1997 | Yamamoto et al. ...... 372/38.01 |
| 5,914,484 A | * | 6/1999 | Tawarayama et al. ...... 250/205 |
| 6,278,322 B1 | | 8/2001 | Aisu et al. |
| 6,563,848 B1 | * | 5/2003 | Iwazaki .................. 372/38.02 |
| 2003/0035451 A1 | | 2/2003 | Ishida et al. |
| 2005/0141576 A1 | * | 6/2005 | Ikeda et al. ............. 372/38.02 |
| 2006/0088070 A1 | * | 4/2006 | Kyougoku et al. ....... 372/38.02 |

FOREIGN PATENT DOCUMENTS

| | | | |
|---|---|---|---|
| JP | 62-118784 | * | 5/1987 |
| JP | 10-093171 | | 4/1998 |
| JP | 10-093171 | * | 10/1998 |
| JP | 3302352 | | 4/2002 |

\* cited by examiner

*Primary Examiner*—Minsun Oh Harvey
*Assistant Examiner*—Delma R Flores-Ruiz
(74) *Attorney, Agent, or Firm*—Dickstein Shapiro LLP

(57) ABSTRACT

A semiconductor laser light emitting circuit includes a semiconductor laser diode emitting a laser light by modulating a current supplied thereto, a light intensity detection circuit that detects the laser light and generates a voltage, and a voltage-current conversion circuit converting a voltage into a current supplied to the laser diode. A S/H capacitance is provided to store electric charge and output a voltage to the voltage/current conversion circuit. A first operational amplifier is provided to output a first current charging the S/H capacitance. A rapidly charging circuit is provided to charge the S/H capacitance with a second current. The rapidly charging circuit terminates charging when the voltage is equal to or more than a second reference voltage.

7 Claims, 6 Drawing Sheets

EXCESSIVE CURRENT INPUT SUPPRESSING SEMICONDUCTOR LASER LIGHT EMITTING CIRCUIT

CROSS-REFERENCE TO RELATED APPLICATION

This application claims priority under 35 USC § 119 to Japanese Patent Application No. 2003-366061, filed on Oct. 27, 2003, the entire contents of which are herein incorporated by reference.

COPYRIGHT NOTICE

A portion of the disclosure of this patent document contains material which is subject to copyright protection. The copyright owner has no objection to the facsimile reproduction by anyone of the patent document or the patent disclosure, as it appears in the Patent and Trademark Office patent file or records, but otherwise reserves all copyright rights.

BACKGROUND OF THE INVENTION

The present invention relates to semiconductor laser drive circuits for use in laser printers, optical disc drives, optical networking apparatuses, and so on, which control driving of a semiconductor laser diode serving as a light source.

Due to the recent downsizing and high-speed modulation of drive current, semiconductor laser diodes are widely used as a light source in laser printers and similar devices.

However, the relationship between the drive current of a laser diode (hereinafter referred to as LD drive current) and an optical output (i.e., a laser light), can considerably change depending upon temperature. As a result, an automatic power control (hereinafter referred to as an APC) circuit that adjusts light intensity to be constant is generally required. As a result, various APC circuits, for example, a sample hold (hereinafter referred to as a S/H) type APC circuit, have been proposed.

In such a S/H type APC circuit, an optical output of a laser diode is converted into current (hereinafter referred to as monitor current) and voltage, in turn, by a photo detector during a light intensity adjusting period. To obtain a prescribed light intensity, a LD's drive current is adjusted in such a manner, that a voltage converted from the monitor current which is proportional to the laser light intensity, regardless of temperature, becomes equivalent to a prescribed reference. After the adjustment, the LD's drive current is continuously modulated into a prescribed light intensity having an adjusted value.

Further, when an abnormality is detected in a laser diode or a power supply, the laser diode is forcibly turned off by a resetting operation while discharging electric charge of a S/H capacitance, and thus, decreases a LD's drive current to avoid deterioration of the laser diode, as described in Japanese Patent Registered No. 3302352. However, if the electric charge of the S/H capacitance is discharged, a charging operation should be started from a zero level in the next APC. One attempt to resolve such a problem is to charge the S/H capacitance at a prescribed voltage before the APC, as discussed in Japanese Patent Application Laid Open No. 10-93171.

However, a S/H capacitance is generally charged at a prescribed constant voltage. Whereas, the threshold current of a laser diode tends to vary due to uneven manufacturing processes and temperature in practical use. Further, a LD's drive current generated by a voltage of the S/H capacitance varies in accordance with the precision of current/voltage conversion in an APC circuit. As a result, the laser drive current sometimes largely exceeds the threshold current and excessively drives and damages the laser diode.

To resolve such problems, one attempt is to decrease the above-mentioned prescribed constant voltage to a prescribed level. However, a voltage appearing at the S/H capacitance when the APC is terminated does not reach a target level, resulting in insufficient LD drive current.

Further, with increased speeds in instruments, an adjusting time period starting from when reset (e.g., an LD is forcibly turned off) is cancelled to when the APC control is terminated, tends to be short. Accordingly, if the S/H capacitance can be rapidly charged up to a target voltage appearing at the end of the APC, as close as possible, the adjusting time period can be short. Further, it is desirable to charge the laser diode regardless of the type and temperature while avoiding breakdown.

SUMMARY

Accordingly, an object of the present invention is to address and resolve the aforementioned and other problems and provide a new semiconductor laser light emitting circuit. The above and other objects are achieved by providing a novel semiconductor laser light emitting circuit including a semiconductor laser diode that emits a laser light by modulating a current supplied thereto, a light intensity detection circuit that detects the laser light and generates a voltage in accordance with the intensity of the laser light, and a voltage/current conversion circuit that converts a voltage into a current to be supplied to the semiconductor laser diode. A sample hold capacitance is provided to store electric charge and output a voltage to the voltage/current conversion circuit. A first operational amplifier is provided to output a first current charging the sample hold capacitance until the voltage detected by the light intensity detection circuit is equivalent to a first reference voltage. A rapidly charging circuit is provided to charge the sample hold capacitance with a second current beside the first current while comparing the output voltage with a second reference voltage less than the first reference voltage when the semiconductor laser diode is turned on. In a preferred embodiment, the rapidly charging circuit terminates charging when the output voltage is equal to or more than the second reference voltage, and the sample hold capacitance is charged only by the first current after the rapidly charging circuit terminates charging.

In another embodiment, a control circuit is provided to output a control signal. In a preferred embodiment, the rapidly charging circuit includes a second operational amplifier that outputs the second current upon receiving the control signal. The second operational amplifier only operates until the output voltage becomes equal to or larger than the second reference voltage.

In yet another embodiment, the second reference voltage is calculated by a formula such as "n*Vref" and "Vref–Vx" in the control circuit, wherein 'n' represents a number less than one, 'Vref' represents the first reference voltage, and 'Vx' represents a voltage less than Vref.

In yet another embodiment, a second operational amplifier is provided to receive an offset voltage through input terminals. In a preferred embodiment, the second operational amplifier automatically stops charging the sample hold capacitance when the output voltage, detected by the light intensity detection circuit, becomes the second reference voltage calculated by subtracting the offset voltage from the first reference voltage.

In yet another embodiment, the voltage/current conversion circuit, the first operational amplifier, and the second operational amplifier are integrated on an integrated circuit ("IC").

In yet another embodiment, the voltage/current conversion circuit, the first operational amplifier, and the rapid charging circuit are integrated on an IC.

BRIEF DESCRIPTION OF DRAWINGS

A more complete appreciation of the present disclosure and many of the attendant advantages thereof will be readily obtained as the same becomes better understood by the following detailed description when considered in connection with the accompanying drawings, wherein.

DESCRIPTION OF THE PREFERRED EMBODIMENTS

Figure 1:
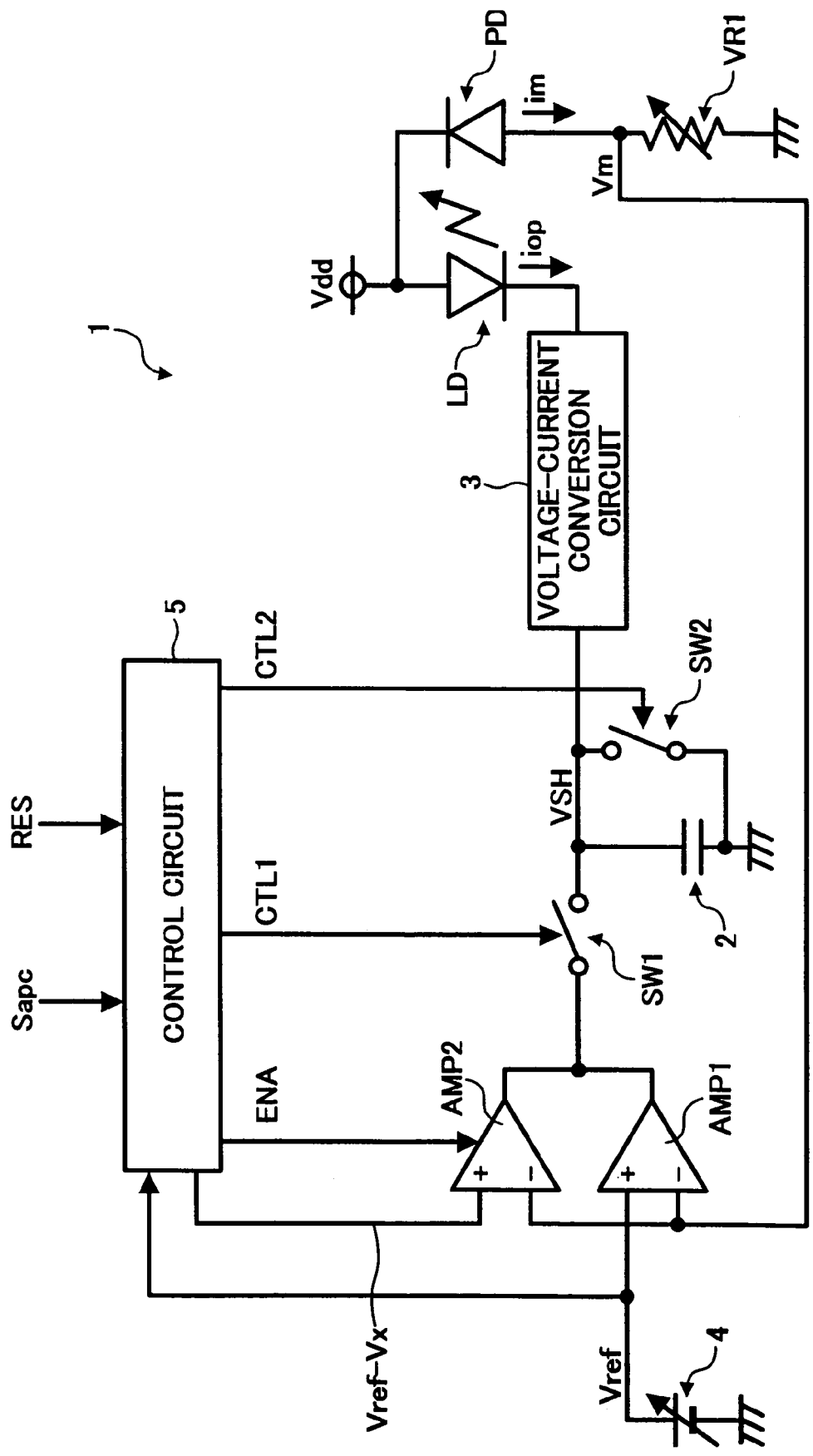
FIG. 1 illustrates an exemplary semiconductor laser drive circuit as one exemplary embodiment of the present invention.

Referring now to the drawings, where like reference numerals designate identical or corresponding parts throughout several views, in particular to FIG. 1, a semiconductor laser drive circuit as a first preferred embodiment is described. The semiconductor laser drive circuit 1 includes, but is not limited to a pair of operational amplifiers AMP1 and AMP2, a pair of switches SW1 and SW2, a S/H capacitance 2 storing voltages outputted from the operational amplifiers AMP1 and AMP2, a voltage-current conversion circuit 3, a variable resistance VR1, a photodiode PD, and a reference voltage generation circuit 4 generating and outputting a reference voltage Vref.

Further included is a control circuit 5 that controls switches SW1 and SW2 and the second operational amplifier AMP2 to operate in accordance with an APC signal Sapc performing APC, as well as a reset signal RES initializing a reset operation so as to forcibly turn off a laser diode LD. In the semiconductor laser drive circuit 1, the current iop flowing through the laser diode LD increases in proportion to the voltage outputted from the operational amplifiers AMP1 and AMP2. The first operational amplifier AMP1 represents a first operational amplifier circuit. The second operational amplifier AMP2 and control circuit 5 collectively represent a rapid charging circuit. The second operational amplifier AMP2 represents a second operational amplifier circuit. The photodiode PD and variable resistance VR1 collectively form an optical intensity detection circuit.

The reference voltage Vref is inputted to a non-inversion input terminal of the first operational amplifier AMP1. A voltage (Vref−Vx) is generated in the control circuit 5 and is inputted to a non-inversion input terminal of the second operational amplifier AMP2. The respective output terminals of the operational amplifiers AMP1 and AMP2 are connected to each other and to one end of first switch SW1 through their connection points. The other end of first switch SW1 is connected to the voltage-current conversion circuit 3. Between the connection point and the ground voltage, the S/H capacitance 2 and second switch SW2 are connected in parallel.

The first switch SW1 executes switching in accordance with a control signal CTL1 transmitted from the control circuit 5, and the second switch SW2 executes switching in accordance with a control signal CTL2 transmitted from control circuit 5. Thus, in order to hold a higher voltage VSH of the S/H capacitance 2 (hereinafter referred to as the voltage of the S/H capacitance 2), the first switch SW1 controls the connection between the S/H capacitance 2 and the terminals of the operational amplifiers AMP1 and AMP2. Further, when the laser diode LD is forcibly turned off, for example, at the time of resetting when power is supplied, the second switch SW2 closes and discharges the S/H capacitance 2.

The voltage-current conversion circuit 3 converts an input voltage into the drive current iop, and is connected to a cathode of the laser diode LD to flow the drive current iop thereto. The anode of the laser diode LD and the cathode of the photodiode PD are connected to the power supply voltage Vdd. Between the anode of the photodiode PD and ground, the variable resistance VR1 is connected. The connection point of the anode of the photodiode PD and the variable resistance VR1 is connected to respective inversion terminals of the operational amplifiers AMP1 and AMP2. The reference voltage Vref is inputted to the control circuit 5. The control circuit 5 calculates and outputs the prescribed voltage value (Vref−Vx) by subtracting an optional value Vx from the input reference voltage Vref to the non-inversion input terminal of the second operational amplifier AMP2. Further, the second operational amplifier AMP2 operates in response to a control signal ENA transmitted from the control circuit 5.

Specifically, the second operational amplifier AMP2 operates when the control signal ENA is high and executes the rapid charging, for example, in conjunction with the first operational amplifier AMP1, when a voltage (Vref−Vx) is larger than a monitor voltage Vm, and terminates the rapid charging when the voltage (Vref−Vx) is equal to or less than the monitor voltage Vm, while the output terminal thereof enters into a high impedance condition. The second operational amplifier AMP2 stops operating when the control signal ENA is in a low level, while an output terminal of the second operational amplifier AMP2 enters into a high impedance condition.

Specifically, the control circuit 5 is enabled to change a level of the control signal ENA to be high at a prescribed time period T1 after a reset condition is cancelled, and to be low after the time period T1 has elapsed. The prescribed time period T1 allows a monitor voltage Vm to sufficiently grow more than the voltage (Vref−Vx) after the reset condition is cancelled.

The photodiode PD, serving as a photo detector, generates and outputs a monitor current im in proportion to the light intensity of the laser diode LD. The variable resistance VR1 then converts the monitor current im into monitor voltage Vm. The first operational amplifier AMP1 compares the reference voltage Vref with the monitor voltage Vm and outputs a voltage in accordance with a difference therebetween. The second operational amplifier AMP2 compares, when in operation, the monitor voltage Vm with the voltage (Vref−Vx), and outputs a voltage in accordance with a difference therebetween.

Figure 2:
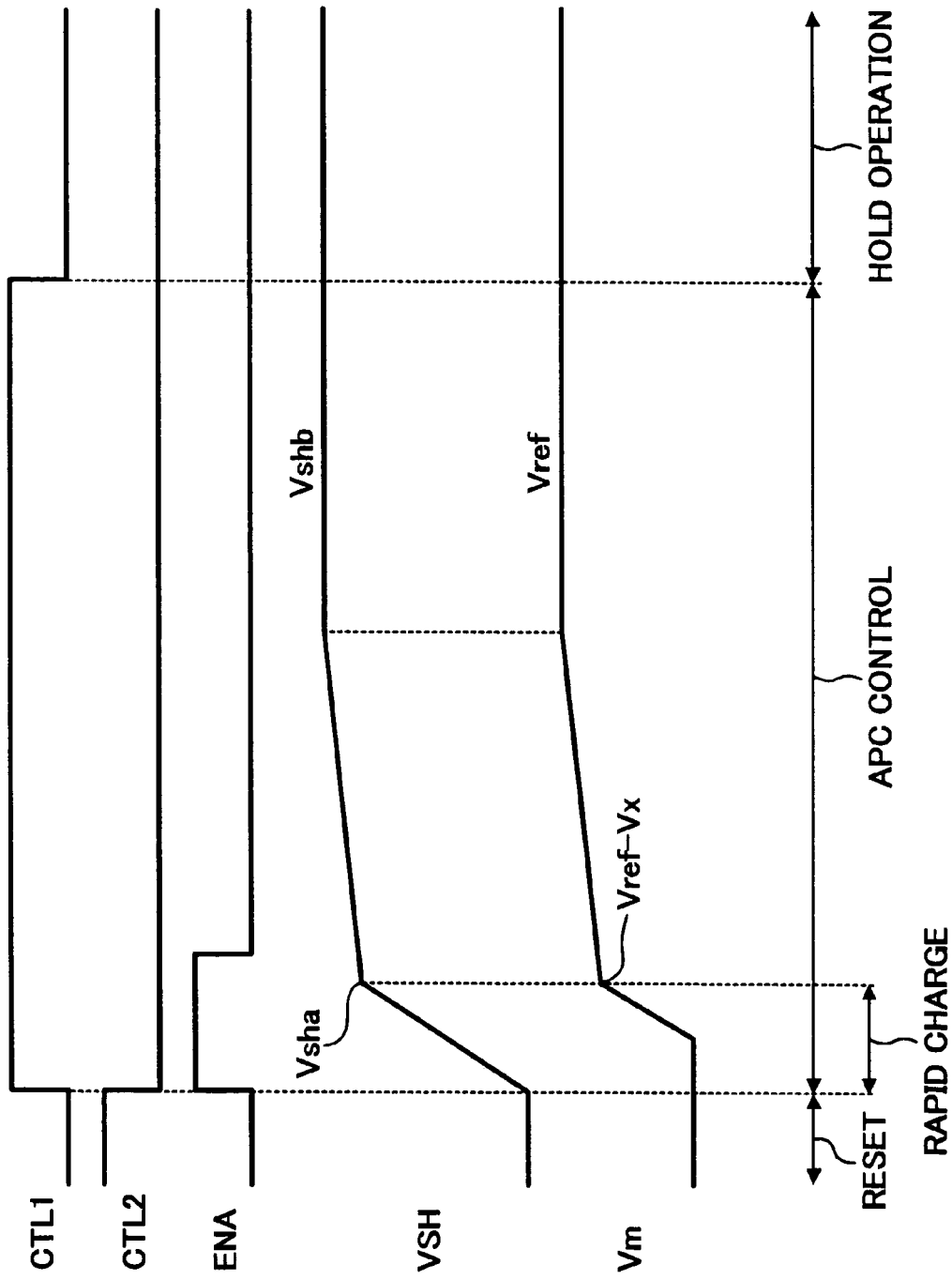
FIG. 2 illustrates a time chart showing various signal generation times.

An operation of the above-mentioned semiconductor laser drive circuit 1 is now described with reference to FIG. 2. When an abnormality such as abnormal lighting occurs in the laser diode LD, a reset operation is executed to forcibly turn off the laser diode LD. The control signal CTL1 simultaneously becomes a low level. The first switch SW1 is turned off and is in a cut-off condition. The second switch SW2 is turned on and is in a conductive condition. Thus, the voltage VSH is zero volts. Accordingly, no current flows into the laser diode LD.

Subsequently, the APC operation is commenced and a control signal CTL1 becomes a high level and thereby the first switch SW1 is turned on. The control signal CTL2 simultaneously becomes a low level and thereby the second switch SW2 is turned off. As a result, the discharge path of the S/H capacitance 2 is cut and a control loop of the APC is formed. Simultaneously, since an inequality between (Vref−Vx)>Vm is established and because the laser diode LD is turned off, the second operational amplifier AMP2 provides rapid charging to the S/H capacitance 2 when the control signal ENA becomes a high level. The second operational amplifier AMP2 can output a larger current than the first operational amplifier AMP1.

Accordingly, the second operational amplifier AMP2 operates to charge the S/H capacitance 2, and as a result, the voltage VSH increases. As shown in FIG. 2, as the voltage VSH increases from zero to the voltage Vsha, the monitor voltage Vm also increases from zero to (Vref−Vx) volts. The first operational amplifier AMP1 simultaneously outputs a voltage corresponding to a difference between the reference voltage Vref and the monitor voltage Vm. Since the rapid charging is executed while comparing the reference voltage Vref with the monitor voltage Vm, the voltage VSH and corresponding LD drive current iop, cannot be values generating an excessively intensive light in relation to the light intensity to be obtained at the time of the APC end, thereby breakdown of the laser diode LD can be substantially avoided.

Further, even if a threshold current of the laser diode LD changes due to temperature or the like, the rapid charging can be executed without excessively driving the laser diode LD, because the S/H capacitance 2 is rapidly charged while the reference voltage Vref is compared with the monitor voltage Vm. Further, a light intensity setting change instruction can be given from an external system by changing the reference voltage Vref. However, any value can be employed as a reference voltage Vref.

Figure 3:
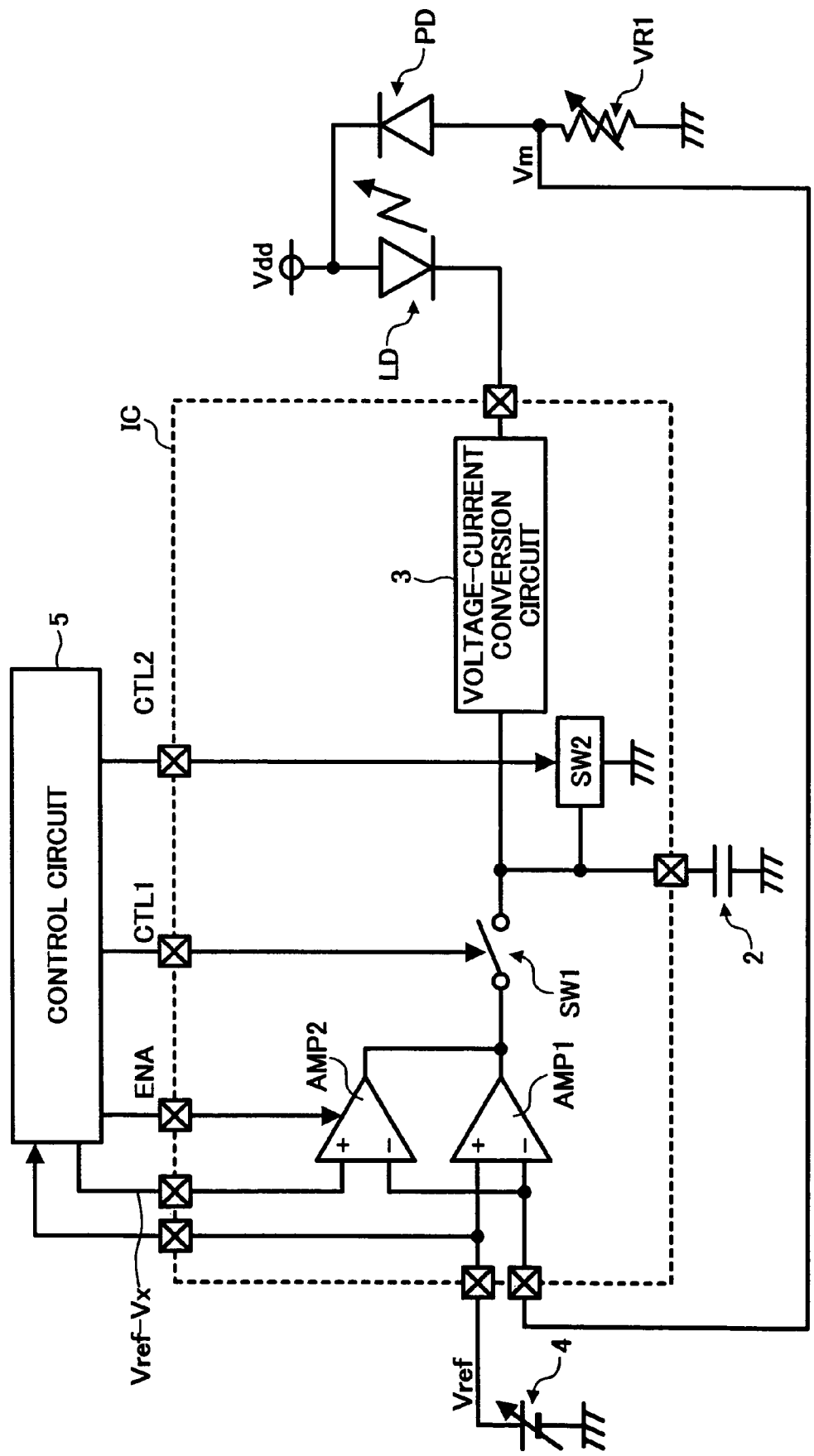
FIG. 3 illustrates an exemplary integrated semiconductor laser drive circuit.

When the monitor voltage becomes more than the prescribed value (Vref−Vx), the output terminal of the second operational amplifier AMP2 becomes a high impedance condition and the rapid charging is terminated. The S/H capacitance 2 is then charged by the first operational amplifier AMP1, up to a target voltage VSH, appearing when the APC operation is terminated. Thus, a prescribed light intensity is obtained from the laser diode LD. Specifically, by means of connecting the operational amplifiers AMP2 and AMP1 in parallel, the time period required in the APC can be minimized. Further, the operational amplifiers AMP1 and AMP2, the switches SW1 and SW2, and the voltage-current conversion circuit 3, as shown in FIG. 1, can be integrated on an IC as shown by a dotted line in FIG. 3.

As described, the control circuit 5 generates and outputs the prescribed value (Vref−Vx). However, the control circuit 5 can generate and output a prescribed value (n*Vref) based upon the input reference voltage Vref to the non-inversion terminal of the second operational amplifier AMP2, wherein a value of the numeral sign n is less than one, specifically, the prescribed value (n*Vref) is less than the reference voltage Vref.

Figure 4:
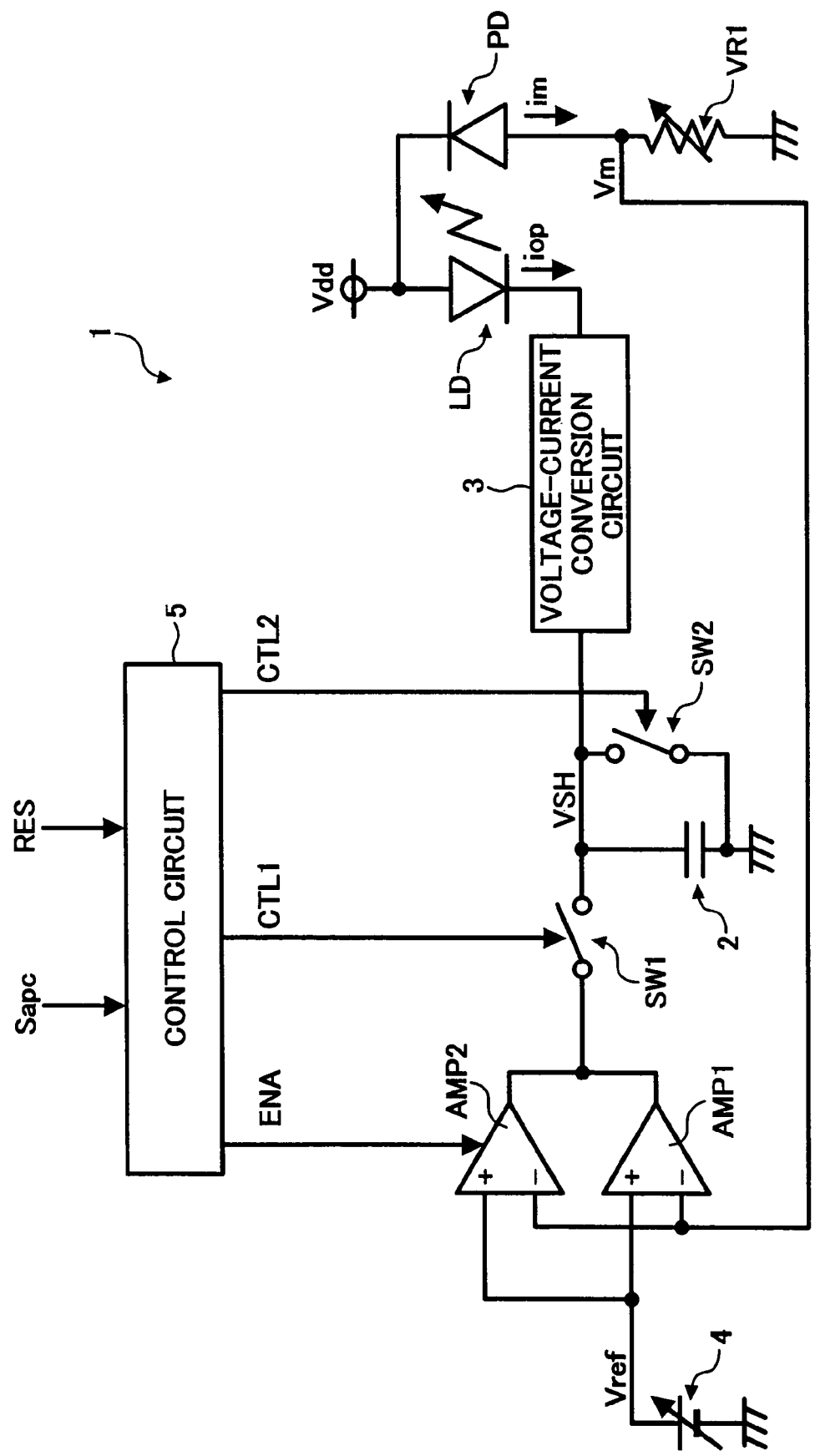
FIG. 4 illustrates a modification of the semiconductor laser drive circuit of FIG. 1.

The control circuit 5 inputs one of the prescribed values (Vref−Vx) and (n*Vref) to the second operational amplifier AMP2. However, an input terminal of a differential amplifier circuit, included in the second operational amplifier AMP2, can be given an offset voltage and the second operational amplifier AMP2 can stop the rapid charging operation under self-control as shown in FIG. 4. Specifically, the difference between the embodiment illustrated in FIG. 1 and the embodiment of FIG. 4, is that the control circuit 5 does not generate and input one of the prescribed values (Vref−Vx) and (n*Vref) to the non-inversion input terminal of the second operational amplifier AMP2, but a monitor voltage Vm is inputted thereto.

Figure 5:
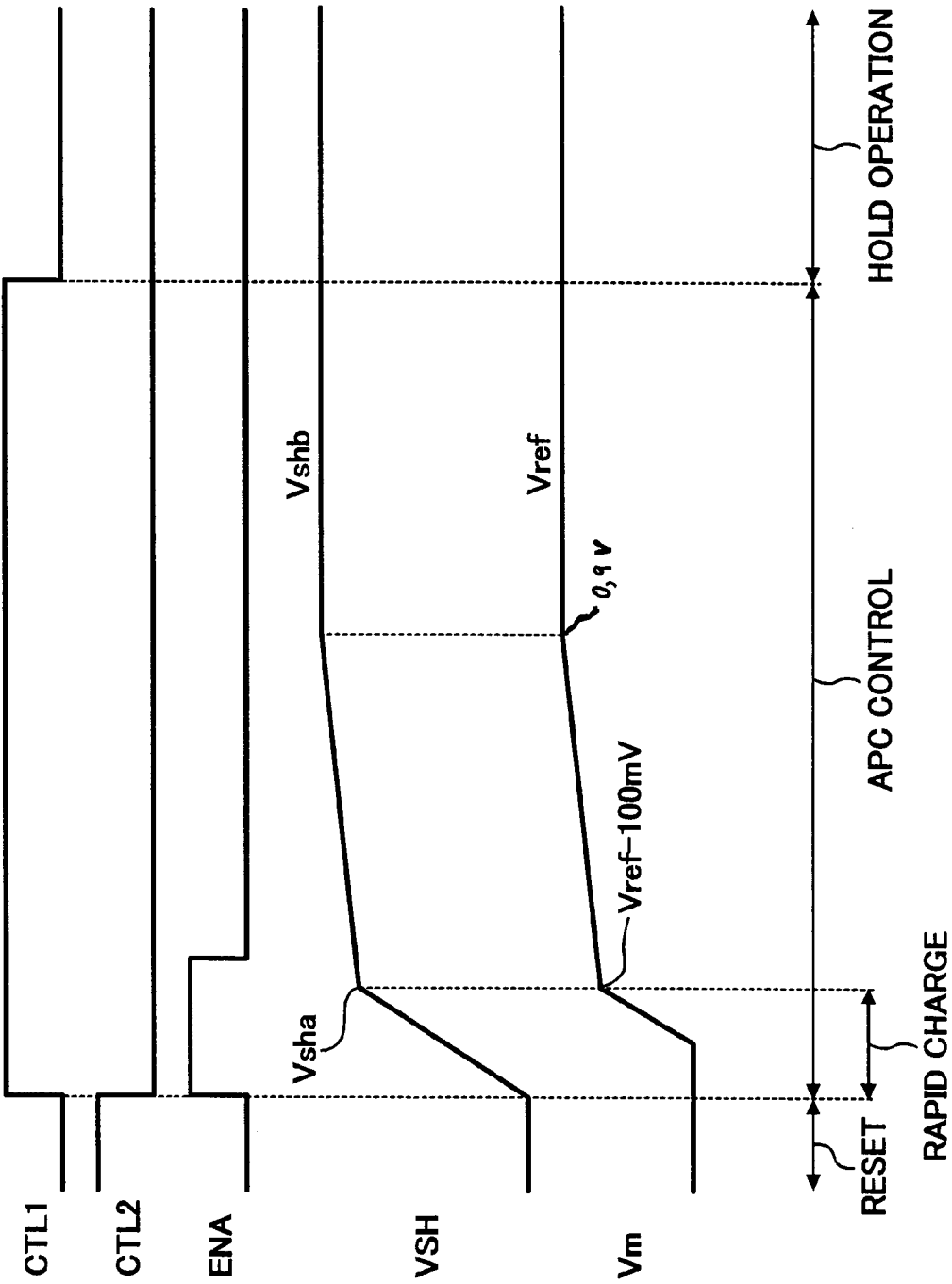
FIG. 5 illustrates a time chart showing various signal general times in the semiconductor laser drive circuit of FIG. 4.

Further, the second operational amplifier AMP2 forms a rapid charging circuit. The offset voltage is preferably applied in a direction so that an output is inverted in the second operational amplifier AMP2, regardless of whether the voltage of the inversion input terminal is smaller than that of the non-inversion input terminal. When the offset voltage is 100 mV and the monitor voltage Vm amounts to (Vref−100 mV), or when the reference voltage Vref is approximately one volt and the monitor voltage Vm becomes 0.9 volts as shown in FIG. 5, the second operational amplifier AMP2 terminates rapid charging of the S/H capacitance 2.

Figure 6:
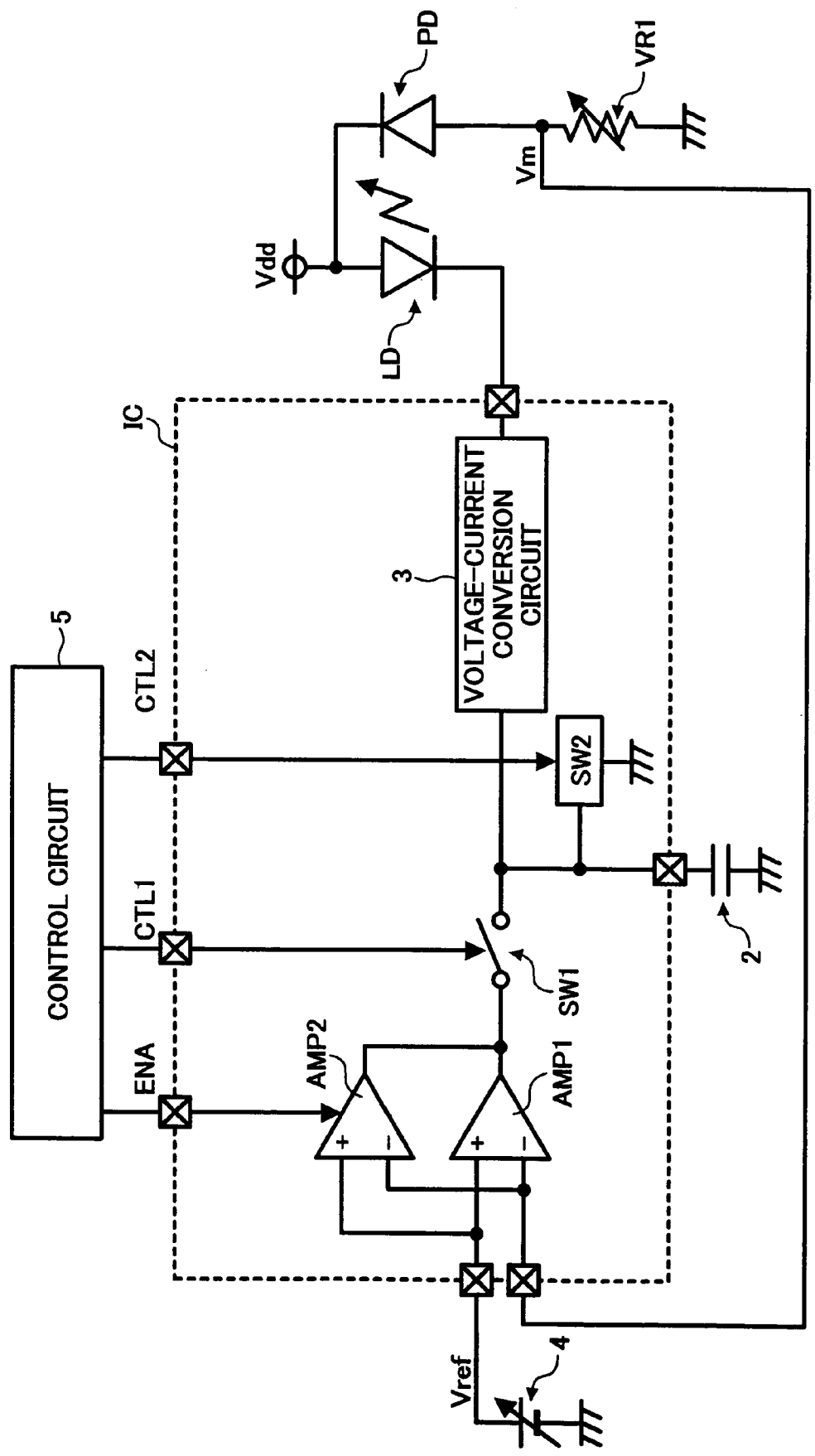
FIG. 6 illustrates an integrated semiconductor laser drive circuit formed by integrating the semiconductor laser drive circuit of FIG. 4.

However, the second operational amplifier AMP2 preferably has an output circuit only for rapid charging an S/H capacitance 2 without any elements that discharges the S/H capacitance 2. That is, if such a discharge element is provided in the second operational amplifier AMP2, the S/H capacitance 2 is discharged when an output level of the second operational amplifier AMP2 is inverted. Accordingly, the laser diode LD does not excessively emit a laser light at the time of the APC end, whereas the second operational amplifier AMP2 terminates rapid charging by itself. Specifically, the second operational amplifier AMP2 can independently execute the APC afterward. Further, the operational amplifiers AMP1 and AMP2, the switches SW1 and SW2, and the voltage-current conversion circuit 3, shown in FIG. 4, can be integrated on an IC as shown in FIG. 6.

According to the above-mentioned embodiments of the present invention, when the laser diode LD is tuned on immediately after the reset cancellation is executed, for example, the semiconductor laser drive circuit 1 enables the second operational amplifier AMP2 to operate, and rapidly charges the S/H capacitance 2 with both operational amplifiers AMP1 and AMP2, and stops the operation of the second operational amplifier AMP2 when the monitor voltage Vm becomes equal to or larger than a prescribed value (Vref−Vx), while enabling only the first operational amplifier AMP1 to rapidly charge the S/H capacitance 2 as an APC operation.

As a result, regardless of the manufacturing unevenness and usage conditions such as temperature, light intensity, etc., of the laser diode LD, and capacitance of the S/H capacitance 2 and the like, an APC operation in all instruments employing a semiconductor laser drive circuit 1 can be increased.

Obviously, numerous additional modifications and variations of the present invention are possible in light of the above teachings without departing from the scope or spirit of the invention. It is intended that the present invention cover modifications and variations of this invention provided they fall within the scope of the following claims or their equivalents.

What is claimed as new and desired to be protected by Letters Patent of the United States is:

1. A semiconductor laser light emitting circuit, comprising: a semiconductor laser diode configured to emit a laser light by modulating a current supplied to the semiconductor laser diode; a light intensity detection circuit configured to detect the laser light and generate a voltage in accordance with an intensity of the laser light; a voltage-current conversion circuit configured to convert a voltage into a current, said voltage-current conversion circuit supplying the current to the semiconductor laser diode; a sample/hold capacitance configured to store electric charge and output a voltage to the voltage/current conversion circuit; a first operational amplifier configured to output a first current charging the sample/hold capacitance until the voltage detected by the light intensity detection circuit is equivalent to a first reference voltage; and a rapidly charging circuit configured to charge the sample/hold capacitance with a second current while comparing the voltage with a second reference voltage less than the first reference voltage when the semiconductor laser diode is turned on; wherein said rapidly charging circuit terminates charging when the voltage is equal to or more than the second reference voltage, and wherein said sample/hold capacitance stores only the first current charge after the rapidly charging circuit terminates charging.

2. The semiconductor laser light emitting circuit according to claim 1, further comprising a control circuit configured to output a control signal, wherein said rapidly charging circuit includes a second operational amplifier configured to output the second current upon receiving the control signal, and said second operational amplifier only operating until an output voltage becomes equal to or larger than the second reference voltage.

3. The semiconductor laser light emitting circuit, according to any one of claims 1 or 2, wherein said second reference voltage is calculated by any one of the following formulas in the control circuit, wherein n represents a number less than one, Vref represent the first reference voltage, and Vx represents a voltage less than Vref; n*Vref Vref−Vx.

4. The semiconductor laser light emitting circuit according to claim 1, further comprising a second operational amplifier configured to receive an offset voltage through input terminals, wherein said second operational amplifier automatically stops charging the sample/hold capacitance when an output voltage detected by the light intensity detection circuit becomes the second reference voltage, wherein said second reference voltage is calculated by subtracting the offset voltage from the first reference voltage.

5. The semiconductor laser light emitting circuit according to claim 2, wherein said voltage-current conversion circuit, the first operational amplifier, and the second operational amplifier are integrated on an IC.

6. The semiconductor laser light emitting circuit according to claim 4, wherein said voltage-current conversion circuit, the first operational amplifier, and the rapid charging circuit are integrated on an IC.

7. A semiconductor laser light emitting circuit, comprising:
a semiconductor laser diode;
a first current source charging a sample/hold capacitance until a voltage is equivalent to a first reference voltage, said voltage driving said semiconductor laser diode; and
a rapidly charging circuit configured to charge the sample/hold capacitance with a second current while comparing said voltage with a second reference voltage less than the first reference voltage when a semiconductor laser diode is turned on;
wherein said rapidly charging circuit terminates charging when said voltage is equal to or more than the second reference voltage, and
wherein said sample/hold capacitance stores charge produced only by the first current source after the rapidly charging circuit terminates charging.

* * * * *